United States Patent
Kim et al.

(10) Patent No.: US 12,533,620 B2
(45) Date of Patent: Jan. 27, 2026

(54) APPARATUS FOR MANUFACTURING DISPLAY DEVICE CAPABLE OF CONTROLLING AMOUNT OF GENERATED FUMES

(71) Applicant: Samsung Display Co., LTD., Yongin-si (KR)

(72) Inventors: Hyoung Joo Kim, Anyang-si (KR); Joong Bae Pyoun, Hwaseong-si (KR); Il Young Jeong, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 940 days.

(21) Appl. No.: 17/735,481

(22) Filed: May 3, 2022

(65) Prior Publication Data
US 2023/0068009 A1    Mar. 2, 2023

(30) Foreign Application Priority Data
Aug. 27, 2021    (KR) .................... 10-2021-0113705

(51) Int. Cl.
*B01D 46/44*    (2006.01)
*B23K 26/36*    (2014.01)
*H10K 71/00*    (2023.01)

(52) U.S. Cl.
CPC ............ *B01D 46/442* (2013.01); *B23K 26/36* (2013.01); *B01D 2279/35* (2013.01); *H10K 71/00* (2023.02)

(58) Field of Classification Search
CPC .. B01D 46/442; B01D 2279/35; B23K 26/36; B23K 26/1464; B23K 26/16; B23K 26/702; B23K 26/38; H10K 71/00; H10K 71/851; G02F 1/1303; H01L 21/67092
See application file for complete search history.

(56) References Cited

U.S. PATENT DOCUMENTS

| | | | |
|---|---|---|---|
| 8,242,472 B2 | 8/2012 | Moriya et al. | |
| 9,539,607 B2* | 1/2017 | Kuwahara | H01L 21/67259 |
| 9,859,495 B2* | 1/2018 | Kang | H10K 71/166 |
| 10,391,345 B2 | 8/2019 | Sukhman et al. | |
| 10,439,168 B2* | 10/2019 | Ahn | G02F 1/1303 |
| 2006/0252233 A1* | 11/2006 | Honma | H01L 21/67132 |
| | | | 438/464 |
| 2011/0074458 A1* | 3/2011 | Di Stefano | G01R 31/2863 |
| | | | 324/757.01 |

(Continued)

FOREIGN PATENT DOCUMENTS

| | | |
|---|---|---|
| KR | P2001-0083591 A | 9/2001 |
| KR | 10-0495329 | 6/2005 |

(Continued)

*Primary Examiner* — Caleb E Henry
(74) *Attorney, Agent, or Firm* — Innovation Counsel LLP

(57) ABSTRACT

According to an embodiment, an apparatus for manufacturing a display device includes a stage on which a target substrate is mounted, and a suction unit positioned above the stage. The suction unit includes a main body including an outer box with top and bottom openings and an inner cup disposed in the outer box, a light emitting unit disposed on at least one inner surface of the outer box, the light emitting unit providing light, and a light receiving unit disposed opposite to the light emitting unit, and disposed on at least one inner surface of the outer box, the light receiving unit receiving the light provided from the light emitting unit.

20 Claims, 15 Drawing Sheets

(56) References Cited

U.S. PATENT DOCUMENTS

| | | | | |
|---|---|---|---|---|
| 2014/0272322 A1* | 9/2014 | Lee | ................ | H01L 21/6715 |
| | | | | 118/301 |
| 2015/0234296 A1* | 8/2015 | Yagi | ................ | H01L 21/67028 |
| | | | | 355/72 |
| 2016/0126049 A1* | 5/2016 | Ahn | ................ | H01J 9/20 |
| | | | | 156/60 |
| 2016/0279651 A1* | 9/2016 | Miyagi | ................ | H01L 21/67115 |
| 2016/0282725 A1* | 9/2016 | Miyagi | ................ | G03F 7/70808 |
| 2019/0172733 A1* | 6/2019 | Yoshida | ................ | H01L 21/02057 |
| 2019/0308276 A1* | 10/2019 | Suzuki | ................ | H01L 21/68785 |
| 2019/0358748 A1* | 11/2019 | Tanaka | ................ | B23K 26/16 |
| 2020/0111715 A1* | 4/2020 | Naohara | ................ | G06T 7/0004 |
| 2020/0140989 A1* | 5/2020 | Kim | ................ | C23C 14/50 |
| 2020/0156188 A1* | 5/2020 | Moon | ................ | B23K 37/0461 |
| 2020/0227678 A1* | 7/2020 | Seo | ................ | H10K 59/12 |
| 2021/0305183 A1* | 9/2021 | Lee | ................ | G02F 1/1303 |
| 2021/0336237 A1* | 10/2021 | Lim | ................ | B08B 15/007 |
| 2021/0359025 A1* | 11/2021 | Jung | ................ | H10K 50/822 |

FOREIGN PATENT DOCUMENTS

| | | |
|---|---|---|
| KR | 10-0514099 | 11/2005 |
| KR | 10-0634750 | 10/2006 |
| KR | 10-2010-0046811 A | 5/2010 |
| KR | 10-0960302 | 6/2010 |
| KR | 10-1074408 | 10/2011 |
| KR | 10-2011-0128998 A | 12/2011 |
| KR | 10-1379411 | 4/2014 |
| KR | 10-2175158 | 11/2020 |

* cited by examiner

300: 310, 320, 330, 340, 350, 360
330: 331, 332, 333, 334
360: 361, 362

300_1: 310, 320, 330, 340, 350_1, 360
330: 331, 332, 333, 334
350_1: 351_1, 352
360: 361, 362

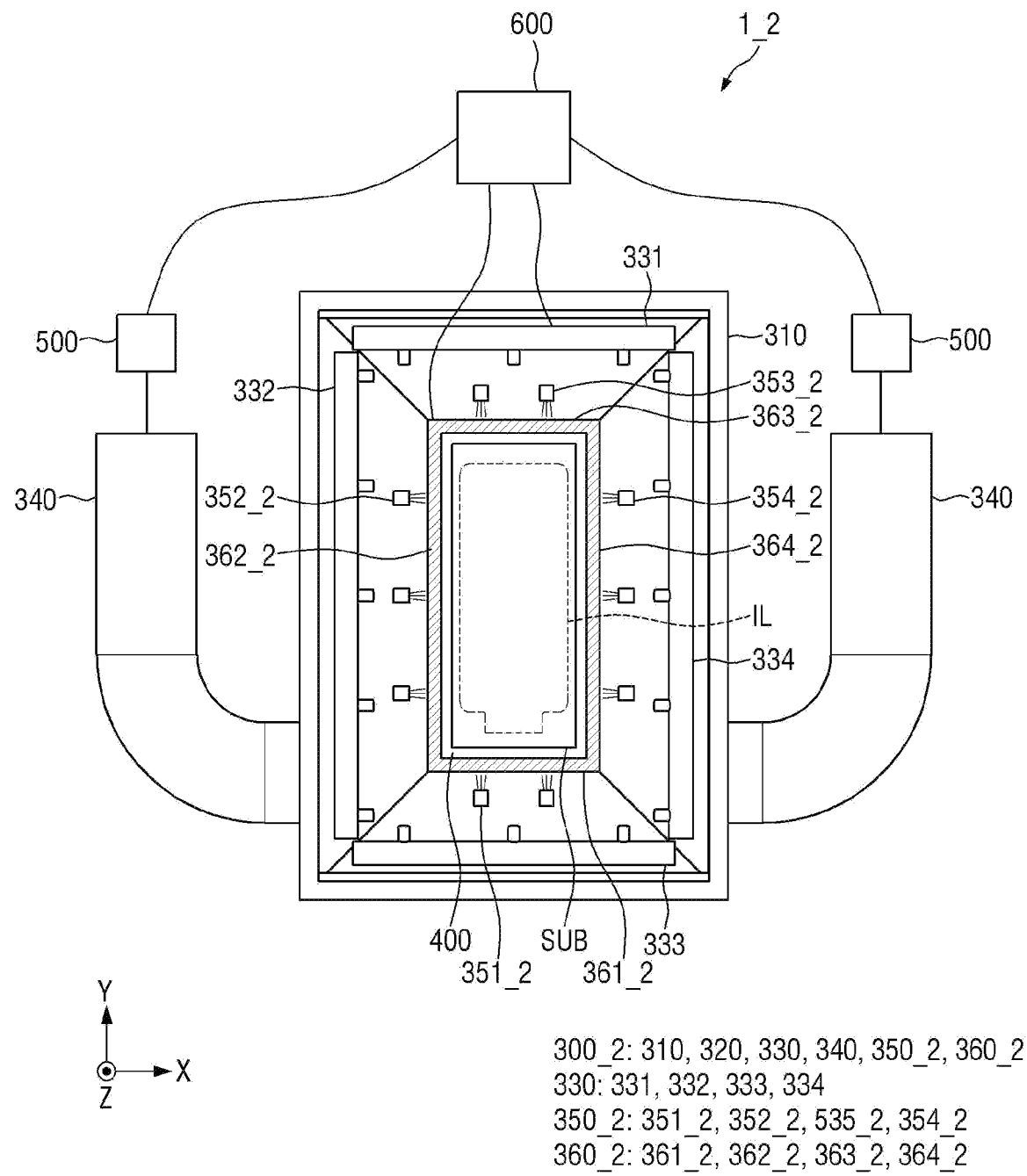

APPARATUS FOR MANUFACTURING DISPLAY DEVICE CAPABLE OF CONTROLLING AMOUNT OF GENERATED FUMES

CROSS-REFERENCE TO RELATED APPLICATION(S)

This application claims priority to and benefits of Korean Patent Application No. 10-2021-0113705 under 35 U.S.C. § 119, filed on Aug. 27, 2021, in the Korean Intellectual Property Office, the entire contents of which are incorporated herein by reference.

BACKGROUND

1. Technical Field

The disclosure relates to an apparatus for manufacturing a display device.

2. Description of the Related Art

The importance of display devices has steadily increased with the development of multimedia technology. Accordingly, various types of display devices such as liquid crystal display (LCD) devices, an organic light emitting display (OLED) devices and the like have been developed.

A display panel constituting the display device is formed by cutting a cell-based substrate formed from a parent substrate, and during this cutting process, fine particles or fumes may be generated. The fine particles or fumes generated at this time may be adsorbed by a pad portion and may cause a contact failure of the pad portion. Thus, such fine particles and fumes need to be removed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide an apparatus for manufacturing a display device capable of controlling the amount of generated fumes by quantitatively measuring the amount of fumes generated during a laser processing process for processing a target substrate.

Additional features of embodiments will be set forth in the description which follows, and in part may be apparent from the description, or may be learned by practice of an embodiment or embodiments herein.

According to an embodiment, an apparatus for manufacturing a display device may include a stage on which a target substrate is mounted, and a suction unit positioned above the stage. The suction unit may include a main body including an outer box with top and bottom openings and an inner cup disposed in the outer box, a light emitting unit disposed on at least one inner surface of the outer box to provide light, and a light receiving unit disposed opposite to the light emitting unit, and disposed on at least one inner surface of the outer box, the light receiving unit receiving the light provided from the light emitting unit.

The light emitting unit and the light receiving unit may be disposed in a region of the outer box that does not overlap the inner cup.

The light receiving unit may include a first light receiving unit extending in a first direction, and a second light receiving unit extending in a second direction that intersects the first direction.

The light emitting unit may be disposed opposite to the first light receiving unit and may include first light emitting modules arranged in the first direction.

The light emitting unit may include second light emitting modules disposed opposite to the second light receiving unit, the second light emitting modules being disposed on the inner surface of the outer box and arranged in the second direction.

The light emitting unit may further include a second light emitting module, the second light emitting module facing a region on the inner surface of the outer box where the first light receiving unit and the second light receiving unit are disposed together.

The apparatus may further include a controller. The suction unit may include an air blower that sprays air toward the stage, the air blower being coupled to the main body. The controller may control operations of the air blower and the suction unit.

The controller may control the air blower to increase an intensity of air sprayed toward an area of the light receiving unit in case that an amount of light received in the area of the light receiving unit is reduced.

The apparatus may further include a dust collection unit connected to the suction unit. The suction unit may include a suction part defined between the outer box and the inner cup, and a connection pipe connecting the suction part to the dust collection unit.

The dust collection unit may provide a negative pressure to the suction unit. The controller may control the dust collection unit to increase a negative pressure provided toward an area of the light receiving unit in case that an amount of light received in the area of the light receiving unit is reduced.

The light emitting unit may surround the inner surface of the outer box. The light receiving unit may surround the inner surface of the outer box. The light emitting unit may be positioned above the light receiving unit.

The light emitting unit may include light emitting modules arranged in a first direction. Each of the light emitting modules may provide light to the light receiving unit disposed opposite to the inner surface of the outer box on which the light emitting module is disposed.

According to an embodiment, an apparatus for manufacturing a display device, may include a stage on which a target substrate is mounted, and a suction unit positioned above the stage. The suction unit may include a suction part providing a negative pressure to the target substrate, a light emitting unit disposed adjacent to the suction part and providing light, and a light receiving unit positioned opposite to the light emitting unit while being adjacent to the suction part and receiving the light provided from the light emitting unit. In a first mode, a light reception amount indicated by the light receiving unit is a normal state. In a second mode, the light reception amount smaller is than in the first mode.

The negative pressure provided by the suction part may be greater in the second mode than in the first mode.

The apparatus may further include a dust collection unit connected to the suction unit, the dust collection unit providing a negative pressure to the suction unit. The suction unit may further include a connection pipe connecting the suction unit to the dust collection unit.

The suction unit may include an air blower that sprays air toward the stage. An intensity of the air sprayed by the air blower may be greater in the second mode than in the first mode.

The light receiving unit may include a first light receiving unit extending in a first direction, and a second light receiving unit extending in a second direction that intersects the first direction.

The light emitting unit may be disposed opposite to the first light receiving unit. The light emitting unit may include first light emitting modules arranged in the first direction.

The light emitting unit may be disposed opposite to the second light receiving unit. The light emitting unit may include second light emitting modules arranged in the second direction.

The light emitting unit may include a second light emitting module that faces a region where the first light receiving unit and the second light receiving unit are disposed together.

According to an embodiment, the apparatus for manufacturing a display device may quantitatively measure the amount of fumes that are generated during a laser processing process for processing a target substrate by using an optical sensor. Accordingly, fume removal can be more effectively achieved by increasing an air injection amount or a negative pressure for sucking fumes in an area where the amount of fumes generated is greater than other areas.

Other features and embodiments may be apparent from the following detailed description, the drawings, and the claims.

BRIEF DESCRIPTION OF THE DRAWINGS

The above and other aspects and features of the disclosure will become more apparent by describing in detail embodiments thereof with reference to the attached drawings, in which:

FIGS. 13 and 14 are schematic views illustrating an apparatus for manufacturing a display device according to still an embodiment.

DETAILED DESCRIPTION OF THE EMBODIMENTS

Figure 1:
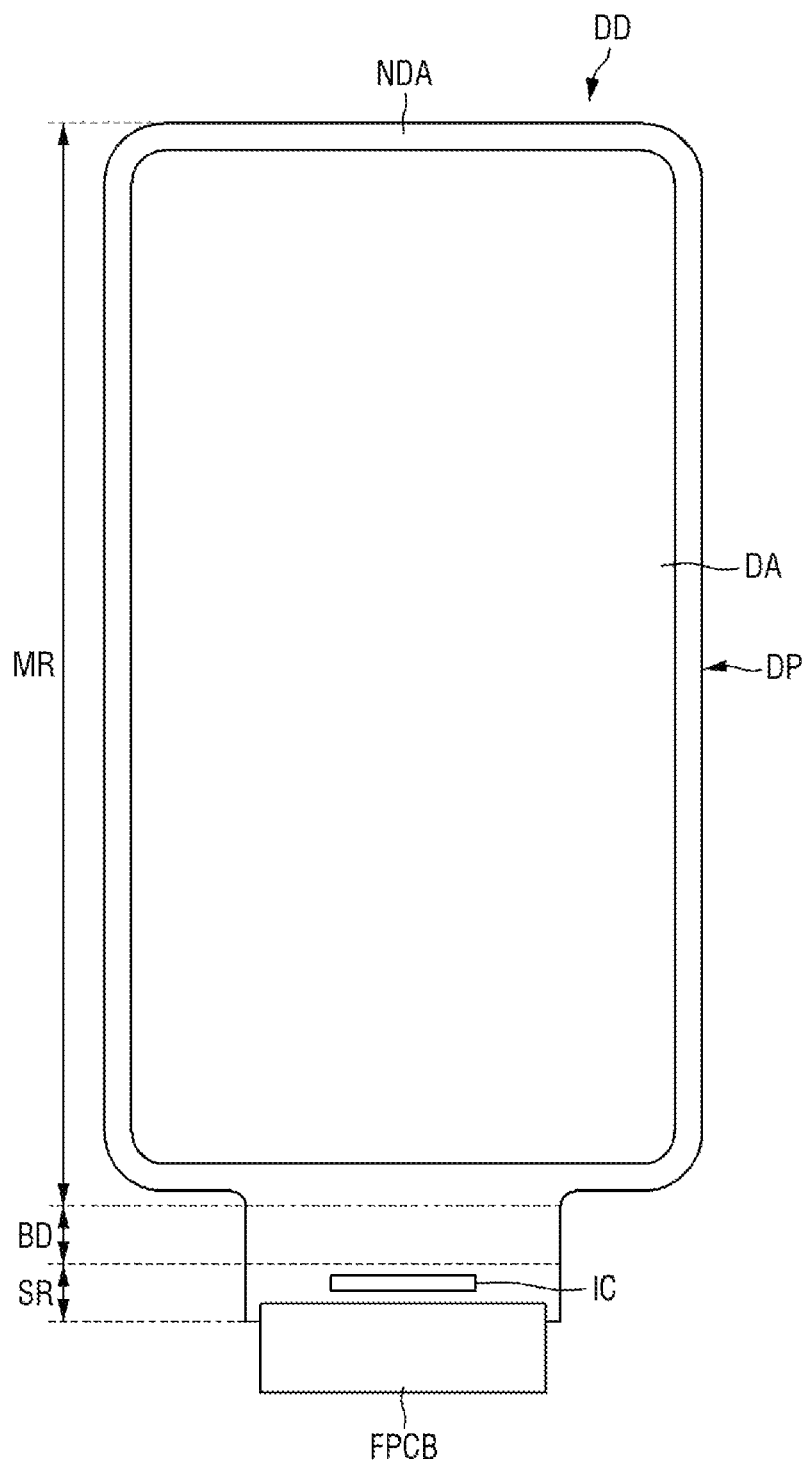
FIG. 1 is a schematic plan view illustrating a display device according to an embodiment.

The embodiments will now be described more fully hereinafter with reference to the accompanying drawings. The embodiments may, however, be provided in different forms and should not be construed as limiting. Rather, these embodiments are provided so that this disclosure will be thorough and complete, and will fully convey the scope of the disclosure to those skilled in the art.

The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about," "substantially," or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
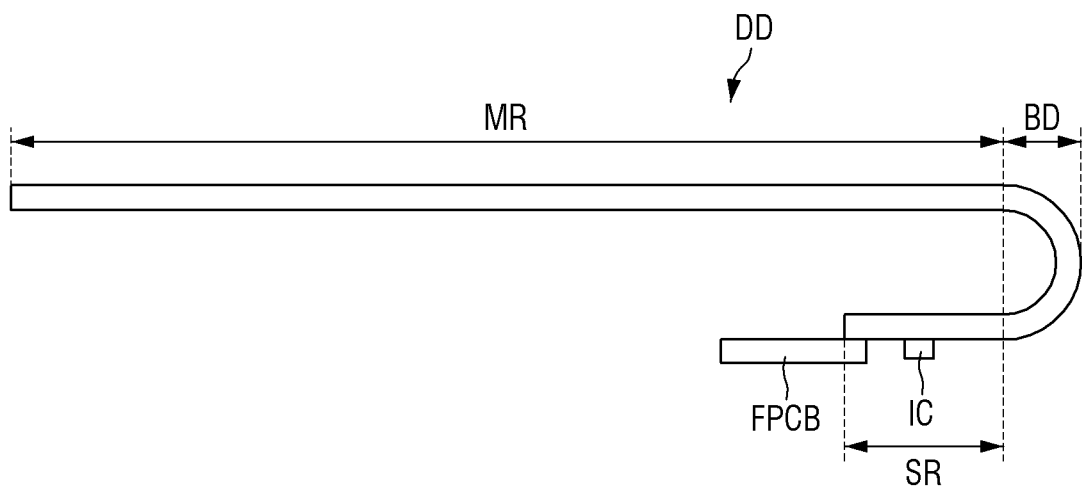
FIG. 2 is a schematic partial cross-sectional view of a display device according to an embodiment.

FIG. 1 is a schematic plan view illustrating a display device according to an embodiment. FIG. 2 is a schematic partial cross-sectional view of a display device according to an embodiment.

In the plan view of FIG. 1, top, bottom, left, and right directions are defined for simplicity of description. A top-bottom direction is a vertical direction or a column direction, and a left-right direction is a horizontal direction or a row direction. In the disclosure, "top edge," "bottom edge," "left edge," and "right edge" of a display panel or the like refer to edges or ends respectively located on the top, bottom, left, and right sides of the display panel, or the like in a plan view. It should be understood that a direction mentioned in the embodiment refers to a relative direction and the embodiment is not limited to the direction mentioned.

Referring to FIGS. 1 and 2, a display device DD is a device for displaying a moving image or a still image. The display device DD may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra-mobile PCs (UMPCs). The display device DD may be, for example, an organic light emitting display device, a plasma display device, a field emission display device, an electrophoretic display device, a quantum dot light emitting display device, a micro LED display device, or the like. Hereinafter, an organic light emitting display device is described as an example of the display device, but the disclosure is not limited thereto.

The display device DD may include a display panel DP. The display panel DP may include a flexible substrate including a flexible polymer material such as polyimide. Accordingly, the display panel DP can be twisted, bent, folded or rolled.

The display panel DP may include a main region MR and a bending region BD connected to one side of the main region MR. The display panel DP may further include a sub-region SR which is connected to the bending region BD and overlaps the main region MR in a thickness direction.

The main region MR may have a rectangular shape with four rounded corners. An edge curved portion of the main region MR may form an external appearance of the display device DD. The bending region BD and the sub-region SR may have smaller widths than the main region MR. An L-shaped cut region may be formed in a portion where the main region MR and the bending region BD are connected to each other. By forming the L-shaped cut region, the display panel DP may be easily bent while maintaining the external appearance of the display panel DP. The planar shape of the above-described display panel DP may be formed by cutting a cell-based substrate from a parent substrate.

In the display panel DP, when a portion displaying a screen is defined as a display area DA and a portion not displaying a screen is defined as a non-display area NDA, the display area DA of the display panel DP is located in the main region MR. The remaining portion except for the display area DA becomes the non-display area NDA of the display panel DP. In an embodiment, a peripheral edge portion of the display area DA in the main region MR, the entire bending region BD, and the entire sub-region SR may be the non-display area NDA. However, the disclosure is not limited thereto, and the bending region BD and/or the sub-region SR may also include the display area DA.

The main region MR may have a shape substantially similar to an outer shape of the display device DD in a plan view. The main region MR may be a flat region located on a plane. However, the disclosure is not limited thereto, and at least one edge of the remaining edges except an edge (side) of the main region MR connected to the bending region BD may be bent in a curved shape or bent in a vertical direction.

The display area DA of the display panel DP may be disposed at the center of the main region MR. The display area DA may include pixels. The display area DA may have a rectangular shape or a rectangular shape with rounded corners. However, the disclosure is not limited thereto, and the display area DA may have various shapes such as a square, other polygons, a circle, an ellipse or the like.

If at least one of the edges other than the edge of the main region MR connected to the bending region BD is curved or bent, the display area DA may also be disposed on the corresponding edge. However, the disclosure is not limited thereto, and the non-display area NDA that does not display a screen may be disposed on the curved or bent edge. Alternatively, both the display area DA and the non-display area NDA may be disposed thereon.

The non-display area NDA may be located around the display area DA in the main region MR. The non-display area NDA of the main region MR may be placed in an area from the outer boundary of the display area DA to the edge of the display panel DP. Signal lines or driving circuits may be disposed in the non-display area NDA of the main region MR to apply a signal to the display area DA. Further, the outermost black matrix may be disposed in the non-display area NDA of the main region MR, but the disclosure is not limited thereto.

The bending region BD may be disposed between the main region MR and the sub-region SR, and at least one of two of the outer edges may include a curved portion. For example, in the bending region BD, the two outer edges connecting one side of the main region MR to one side of the sub-region SR may be curved portions having the same curvature. The distance between the two outer edges may decrease as going from the main region MR to the sub-region SR.

In the bending region BD, the display panel DP may be bent with a curvature downward in a thickness direction, i.e., in a direction opposite to a display surface. The bending region BD may have a constant radius of curvature. However, without being limited thereto, the bending region BD may have a different radius of curvature for each section. The surface of the display panel DP is reversed as the display panel DP is bent in the bending region BD. In other words, one surface of the display panel DP facing upward may be changed to face outward through the bending region BD and then to face downward.

The sub-region SR extends from the bending region BD. The sub-region SR may extend in a direction parallel to the main region MR from a point where bending is completed. The sub-region SR may overlap the main region MR in the thickness direction of the display panel DP. The sub-region SR may overlap the non-display area NDA of the edge of the main region MR and further overlap the display area DA of the main region MR. The width of the sub-region SR may be the same as the width of the bending region BD, but is not limited thereto.

A driving chip IC may be disposed on the sub-region SR of the display panel DP. The driving chip IC may include an integrated circuit for driving the display panel DP. In an embodiment, the integrated circuit may be, but is not limited to, a data driving integrated circuit that generates and provides a data signal. The driving chip IC may be mounted on the display panel DP in the sub-region SR. The driving chip IC may be mounted on a surface of the display panel DP, the same surface as the display surface. The driving chip IC may be mounted on the surface of the display panel DP facing downward in the thickness direction as the bending region BD is bent and reversed as described above such that the upper surface of the driving chip IC faces downward. The driving chip IC may be attached onto the display panel DP through an anisotropic conductive film or through ultrasonic bonding. As described above, during a cutting process for forming the display panel DP, fine particles or fumes may be generated. The fine particles or fumes generated at this time may interfere with the attachment of the driving chip IC.

A pad portion (not shown) may be provided at an end of the sub-region SR of the display panel DP, and a printed circuit board FPCB may be connected to the pad portion (not shown). The printed circuit board FPCB may be a flexible printed circuit board or film.

The display panel DP may be formed by cutting a cell-based substrate formed from a parent substrate. The cutting process may be performed by a display device manufacturing apparatus including a laser module. During the cutting process, fumes may be generated, and the fumes may interfere with the cutting process by causing a phenomenon that blocks the laser beam. Fumes may remain in the display panel DP and cause a display defect. Accordingly, fumes need to be removed in real time when the substrate is cut.

Figure 3:
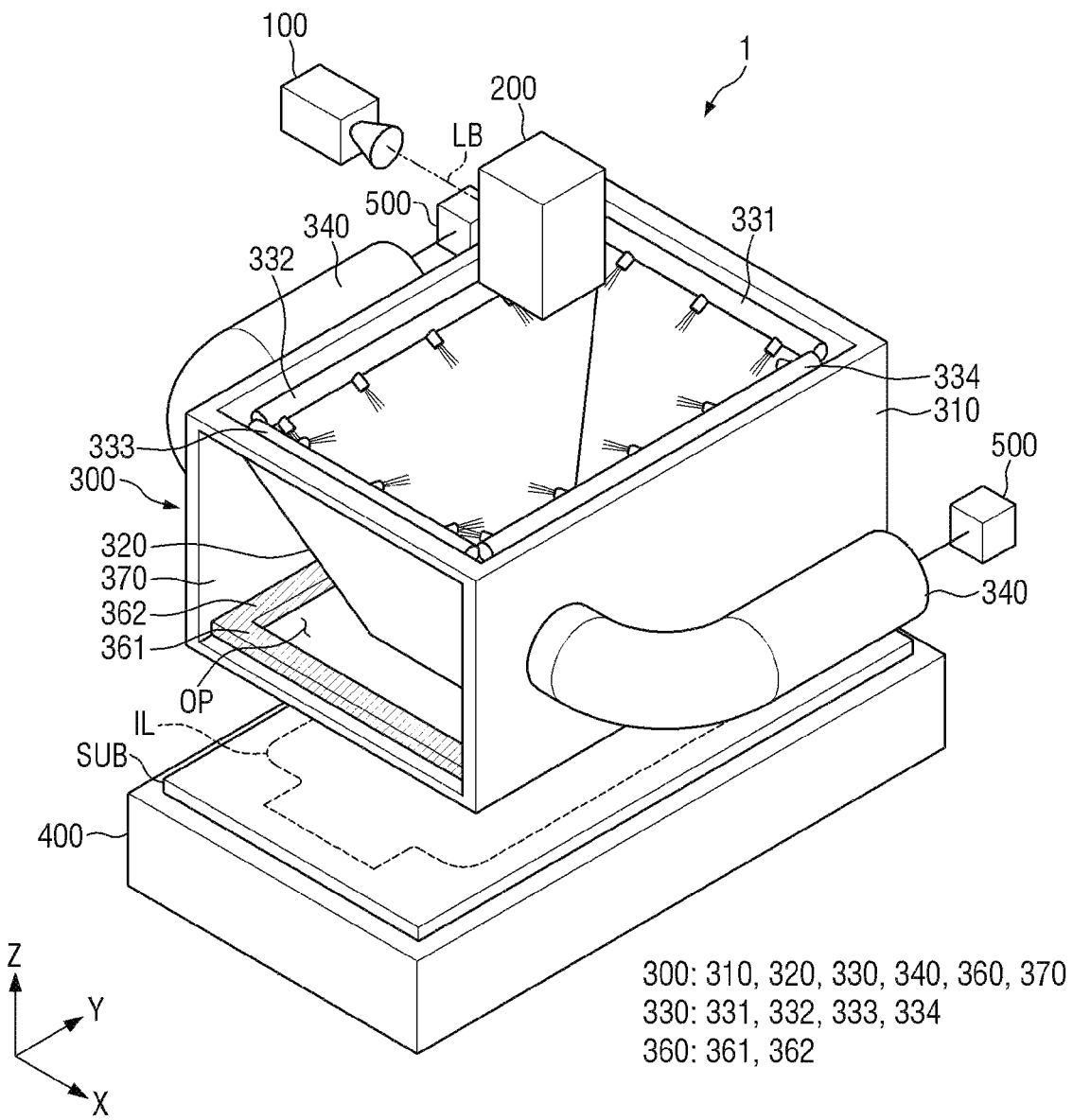
FIG. 3 is a schematic perspective view of an apparatus for manufacturing a display device according to an embodiment.
Figure 4:
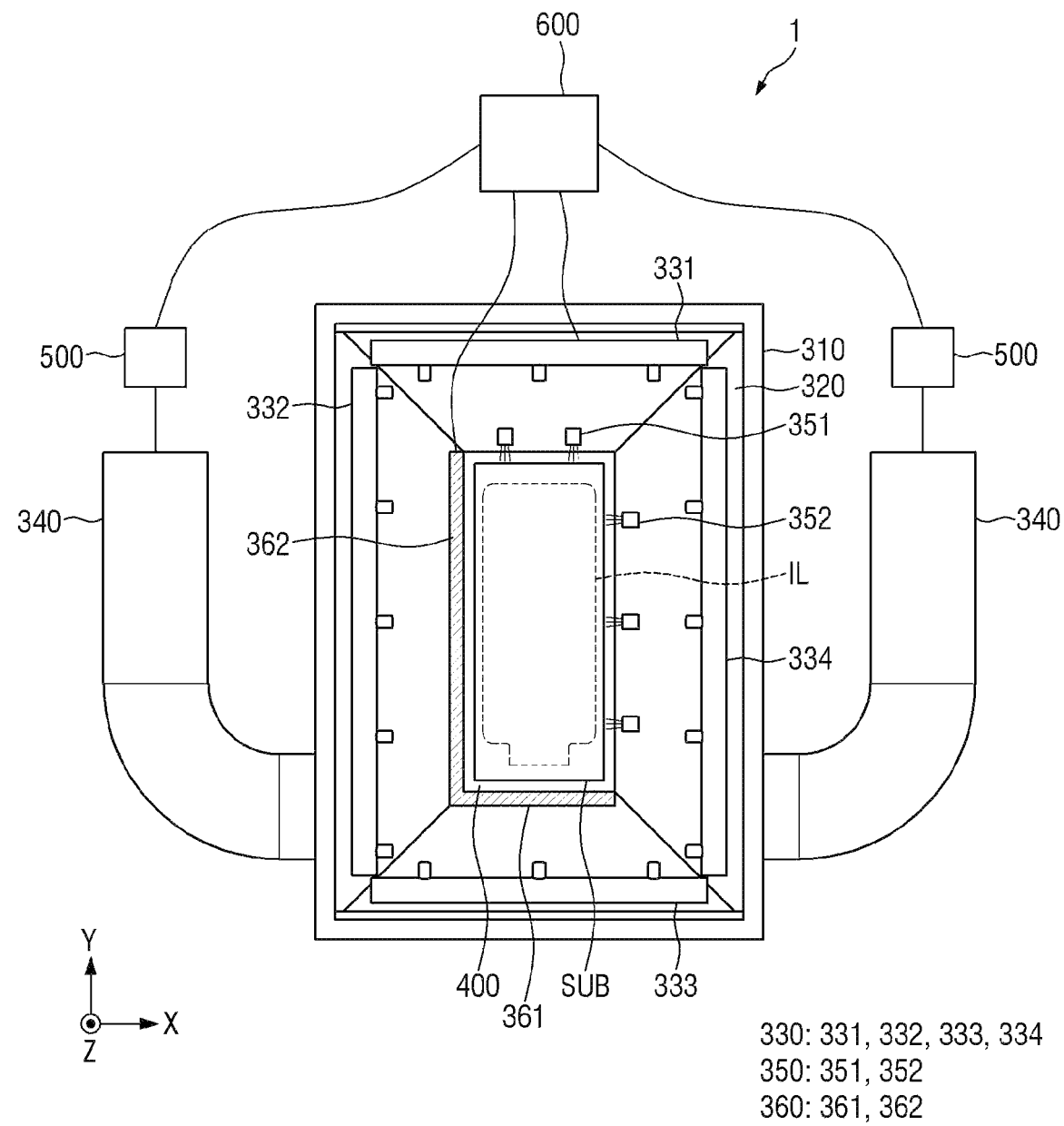
FIG. 4 is a schematic view of an apparatus for manufacturing a display device according to an embodiment viewed from above.

FIG. 3 is a schematic perspective view of an apparatus for manufacturing a display device according to an embodiment. FIG. 4 is a schematic view of an apparatus for manufacturing a display device according to an embodiment viewed from above.

Referring to FIGS. 3 and 4, a display device manufacturing apparatus 1 according to an embodiment may remove fumes FM1 generated during the cutting process while cutting a target substrate SUB in real time.

The target substrate SUB processed by the display device manufacturing apparatus 1 may be a substrate to be used for the display panel DP of the display device DD (refer to FIGS. 1 and 2).

As shown by a dotted line in FIG. 3, the target substrate SUB before cutting may have a rectangular shape. In order to form the display panel DP to have four rounded corners and have the L-shaped cut regions of the bending region BD and the main region MR, a laser beam LB may be irradiated to cut along an irradiation line IL of a closed curve shape. The irradiation line IL may be an imaginary cutting line to which the laser beam LB is irradiated on the target substrate SUB. However, the disclosure is not limited thereto, and an actual irradiation line IL may be formed. The irradiation line IL may be an edge of the display panel DP after cutting.

The display device manufacturing apparatus 1 according to an embodiment may be an apparatus that irradiates the laser beam LB onto the target substrate SUB to cut the target substrate SUB, capable of removing the fumes FM1 generated during the cutting process. The display device manufacturing apparatus 1 may include a laser module 100, an optical system 200, a suction unit 300, a stage 400, a dust collecting module 500 and a controller 600.

The laser module 100 may emit the laser beam LB. The laser beam LB may be irradiated along the irradiation line IL of the target substrate SUB. The laser module 100 may include a gas laser such as a carbon dioxide laser, an excimer laser, and a helium-neon laser, or a solid-state laser such as a ruby laser, a glass laser, a YAG laser, and a YLF laser.

The optical system 200 may receive the laser beam LB from the laser module 100 and control the path of the laser beam LB to irradiate the laser beam onto the target substrate SUB.

In an embodiment, the optical system 200 may include an optical case 210, a scanner 220 disposed inside the optical system 200 and a lens 230.

The scanner 220 may adjust the optical path of the laser beam LB. The scanner 220 may control the optical path of the laser beam LB so that the laser beam LB is irradiated along the irradiation line IL on the target substrate SUB. For example, the scanner 220 may include a Galvano scanner or a polygon mirror, but is not limited thereto.

The lens 230 may focus the laser beam LB. The lens 230 may be positioned after the scanner 220 on the optical path of the laser beam LB. The laser beam LB may pass through the lens 230 after passing through the scanner 220.

Also, although not shown, the optical system 200 may further include a homogenizer for homogenizing the shape of the laser beam LB.

The suction unit 300 may be positioned above the stage 400. When the laser beam LB is irradiated along the irradiation line IL of the target substrate SUB, the fumes FM1 may be generated. The suction unit 300 may suck the fumes FM1 to discharge the fumes FM1 to the outside.

The suction unit 300 may include a main body 310 and 320, an air blower 330, a connection pipe 340 and optical sensors 350 and 360.

The main body 310 and 320 may have a hollow inner structure that is opened upward and downward so that the laser beam LB provided from the optical system 200 is irradiated onto the target substrate SUB. The main body 310 and 320 may have a structure capable of effectively sucking the fumes FM1 generated during the process of irradiating the laser beam LB onto the target substrate SUB. The main body 310 and 320 may include an outer box 310 with top and bottom openings and an inner cup 320 disposed in the outer box 310. The inner cup 320 may include top and bottom openings respectively corresponding to the top and bottom openings of the outer box 310. The main body 310 and 320 may trap the fumes FM1, which are generated during the process of irradiating the laser beam LB onto the target substrate SUB, in the suction unit 300 so that the fumes FM1 do not escape to the outside.

The outer box 310 may have a substantially rectangular pillar shape, but is not limited thereto, and may have a shape of a cylinder or a polygonal pillar other than a rectangular pillar. In an embodiment, the outer box 310 may have a rectangular pillar shape including a short side extending in a first direction X and a long side extending in a second direction Y.

The outer box 310 may be empty inside and accommodate the inner cup 320. As will be described later, at least one side of the outer box 310 may be provided with a transparent viewing window 370 through which the inside of the outer box 310 can be observed. The connection pipe 340 communicating with the inside of the outer box 310 may be coupled to at least one side of the outer box 310.

The inner cup 320 may be disposed in the outer box 310. The inner cup 320 may include sidewalls having a hollow truncated quadrangular pyramid shape. The inner cup 320 may be coupled to the outer box 310, but may be separated in some cases. The inner cup 320 may have a three-dimensional structure similar to a rectangular funnel or a hopper. For example, if the outer box 310 has a cylindrical shape, the inner cup 320 may have a three-dimensional structure similar to a circular funnel.

An inner space of the inner cup 320 may provide a passage through which the laser beam LB passes. The laser beam LB may pass through the openings of the main body 310 and 320 to be irradiated onto the target substrate SUB. Accordingly, in the laser beam LB irradiation process, at least a part of the irradiation line IL of the target substrate SUB may be positioned inside the bottom opening of the main body 310 and 320 in a plan view.

The top opening of the main body 310 and 320 may be defined by the upper end of the inner cup 320, and the bottom opening of the main body 310 and 320 may be defined by the lower end of the inner cup 320. The top opening of the main body 310 and 320 may be larger than the bottom opening thereof. The inside of the inner cup 320 may have a structure in which the internal width gradually decreases like a funnel. Accordingly, a downward airflow may be formed inside the inner cup 320 so that the fumes FM1 can be sucked effectively. The outer surface of the inner cup 320 and the inner surface of the outer box 310 may contact each other.

The air blower 330 may be disposed on the top portion of the main body 310 and 320. The air blower 330 may spray air AR toward the target substrate SUB. The air AR provided by the air blower 330 may form a downward airflow in the inner space of the inner cup 320.

The air blower 330 may include first to fourth air blowers 331, 332, 333 and 334. The first and third air blowers 331 and 333 may be disposed to face each other along the short side of the outer box 310 extending in the first direction X, and the second and fourth air blowers 332 and 334 may be disposed to face each other along the long side of the outer box 310 extending in the second direction Y. The first and third air blowers 331 and 333 may extend in the first direction X, but may be disposed to face each other in the second direction Y. The second and fourth air blowers 332 and 334 may extend in the second direction Y, but may be disposed to face each other in the first direction X.

Each of the first to fourth air blowers 331, 332, 333 and 334 may include nozzles arranged along the extending direction. Each of the first to fourth air blowers 331, 332, 333 and 334 may spray the air AR into the inner space of the inner cup 320 through the nozzles. The spraying direction of the air AR may be substantially the same as the direction indicated by the nozzle. The direction indicated by the nozzle may be adjusted. The air AR sprayed through the nozzle may form an airflow in the spraying direction.

The airflows formed by the air AR sprayed from the nozzles included in the first to fourth air blowers 331, 332, 333 and 334 may intersect in the inner space of the inner cup 320, but the disclosure is not limited thereto.

The air AR sprayed from the air blower 330 may be directed toward the opening of a suction part OP below the other air blower 330 disposed to face it. Accordingly, the air AR sprayed from the air blower 330 may be sucked into the suction part OP at the opposite side.

In the inner space of the inner cup 320, an airflow may be formed along the spraying direction of the air AR. The airflow formed in the inner space of the inner cup 320 may assist the fumes FM1 to be sucked into the suction part OP. The fumes FM1 may be sucked into the suction part OP with the airflow.

The connection pipe 340 may be disposed outside the outer box 310. For example, the connection pipe 340 may be disposed on one side and the other side of the outer box 310 in the first direction X. A side of the connection pipe 340 may be spatially connected to the suction part OP which is a space between the outer box 310 and the inner cup 320, and the other side thereof may be connected to the dust collecting module 500 to be described below. The connection pipe 340 may serve as a passage for providing a negative pressure provided from the dust collecting module 500 to the suction part OP.

The optical sensors 350 and 360 may be disposed on the inner surface of the outer box 310. The optical sensors 350 and 360 may include a light emitting unit 350 and a light receiving unit 360. The light emitting unit 350 may provide light LT and the light receiving unit 360 may quantitatively measure the amount of light LT provided from the light emitting unit 350. The light emitting unit 350 and the light receiving unit 360 may face each other. The light emitting unit 350 and the light receiving unit 360 may be disposed in an area of the inner surface of the outer box 310 that does not overlap the inner cup 320. Accordingly, the light LT provided from the light emitting unit 350 may be received by the light receiving unit 360.

In an embodiment, the light emitting unit 350 may include a first light emitting module 351 disposed on the inner surface of the outer box 310 on a side of the second direction Y and a second light emitting module 352 disposed on the inner surface of the outer box 310 on one side of the first direction X. Multiple first light emitting modules 351 and the second light emitting modules 352 may each be provided. The first light emitting module 351 may be arranged along the first direction X and the second light emitting module 352 may be arranged along the second direction Y. Each first light emitting module 351 may irradiate the light LT toward the other side in the second direction Y. Each second light emitting module 352 may irradiate the light LT toward the other side in the first direction X.

The light receiving unit 360 may face the light emitting unit 350. The light receiving unit 360 may be disposed across the inner surface of the outer box 310 on the other side of the light emitting unit 350 in the first direction X and the inner surface of the outer box 310 in the other side of the light emitting unit 350 in the second direction Y. The light receiving unit 360 may include a first light receiving unit 361 disposed on the inner surface of the outer box 310 on the other side in the second direction Y and a second light receiving unit 362 disposed on the inner surface thereof on the other side in the first direction X. The first light receiving unit 361 and the second light receiving unit 362 may be connected to each other. The first light receiving unit 361 may quantitively measure the amount of light LT provided from the first light emitting module 351, and the second light receiving unit 362 may quantitively measure the amount of light LT provided from the second light emitting module 352. The first light receiving unit 361 and the second light receiving unit 362 may be arranged repetitively, and may quantitively measure the amount of light LT provided from the light emitting unit 350. The amount of light LT measured by the light receiving unit 360 may be provided to the controller 600.

The optical sensors 350 and 360 may quantitively measure the amount of the fumes FM1 generated. A method for measuring the amount of the generated fumes FM1 using the optical sensors 350 and 360 will be described with reference to FIGS. 6 to 9.

The suction unit 300 may further include a viewing window 370. The viewing window 370 may be disposed on at least one surface of the outer box 310. For example, the viewing window 370 may be disposed on the other surface of the outer box 310 in the second direction Y. Since the viewing window 370 is made of transparent glass, the user can observe through the viewing window 370 the process in which the fumes FM1 are sucked via the suction unit 300.

The stage 400 may provide a space in which the target substrate SUB is mounted and may support the target substrate SUB. The target substrate SUB may be mounted on the stage 400. The stage 400 may include an adsorption hole (not shown) disposed on the top surface thereof and opened upward. A negative pressure provided through the adsorption hole (not shown) may fix the target substrate SUB. The target substrate SUB may be generally disposed at the center of the stage 400, but is not limited thereto.

The dust collecting module 500 may collect the fumes FM1 sucked by the suction unit 300. The dust collecting module 500 may be connected to the connection pipe 340 of the suction unit 300. The dust collecting module 500 may provide a negative pressure to the suction unit 300 through the connection pipe 340. The dust collecting module 500 may include a motor, a pump, a fan, or the like for adjusting the negative pressure provided through the suction unit 300. However, the disclosure is not limited thereto, and a motor, a pump, a fan, or the like may be provided separately from the dust collecting module 500. The dust collecting module 500 may include a filter for filtering fumes FM1.

The controller 600 may control the overall operation of each component included in the display device manufacturing apparatus 1. For example, the controller 600 may control the intensity of the laser beam LB generated by the laser module 100 and whether the laser beam LB is irradiated or not. The controller 600 may control the optical system 200 to control the optical path of the laser beam LB.

The controller 600 may control suction of the fumes FM1 through the suction unit 300. The controller 600 may control whether the air AR is sprayed through the air blower 330 or not and the spraying intensity, and may adjust the intensity of the negative pressure provided by the dust collecting module 500.

Based on the amount of the generated fumes FM1 for each area quantitatively measured through the optical sensors 350 and 360, the controller 600 may adjust the air AR spraying intensity of the air blower 330 and the intensity of the negative pressure provided by the dust collecting module 500. A detailed description thereof will be given below.

Figure 5:
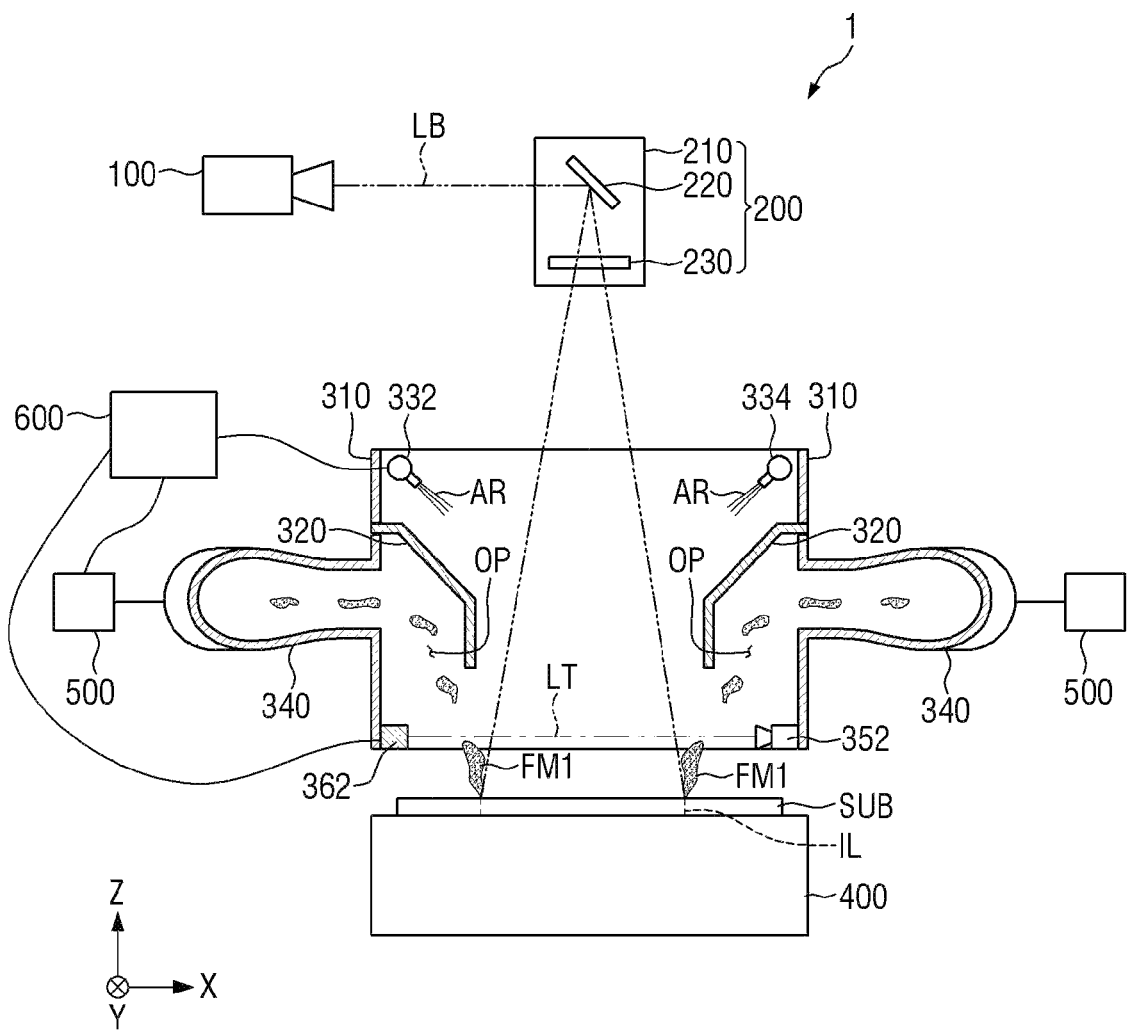
FIG. 5 is a schematic view of a manufacturing process of a display device using an apparatus for manufacturing the display device according to an embodiment.

FIG. 5 is a schematic view of a manufacturing process of a display device using an apparatus for manufacturing the display device according to an embodiment.

Referring to FIG. 5, the laser module 100 may provide the laser beam LB toward the optical system 200. The laser beam LB may be irradiated onto the irradiation line IL on the target substrate SUB after passing through the scanner 220 and the lens 230. The scanner 220 may control the irradiation direction so that the laser beam LB is irradiated onto the irradiation line IL on the target substrate SUB. Irradiation of the laser beam LB using the laser module 100 and the optical path control of the laser beam LB using the optical system 200 may be performed by the controller 600.

In case that the laser beam LB is irradiated onto the target substrate SUB, the fumes FM1 may be generated as the target substrate SUB is partially removed. The fumes FM1 may refer to fumes FM1 in a first mode state, generated in a substantially constant amount for each area on the target substrate SUB.

The controller 600 may operate the dust collecting module 500 together with the laser beam LB irradiation. The dust collecting module 500 may provide a negative pressure to the suction part OP through the connection pipe 340. The suction part OP may suck the fumes FM1 by the negative pressure provided from the dust collecting module 500. The fumes FM1 sucked by the suction part OP may exit to the dust collecting module 500 through the connection pipe 340. The air blower 330 may spray the air AR toward the irradiation line IL of the target substrate SUB where the fumes FM1 are generated. Through this, the air blower 330 may assist the fumes FM1 to be sucked into the suction part OP.

The controller 600 may quantitively measure the amount of the generated fumes FM1 through optical sensors 350 and 360. Measurement of the amount of the generated fumes FM1 using the optical sensors 350 and 360 will be described below with reference to FIGS. 6 to 9.

Figure 6:
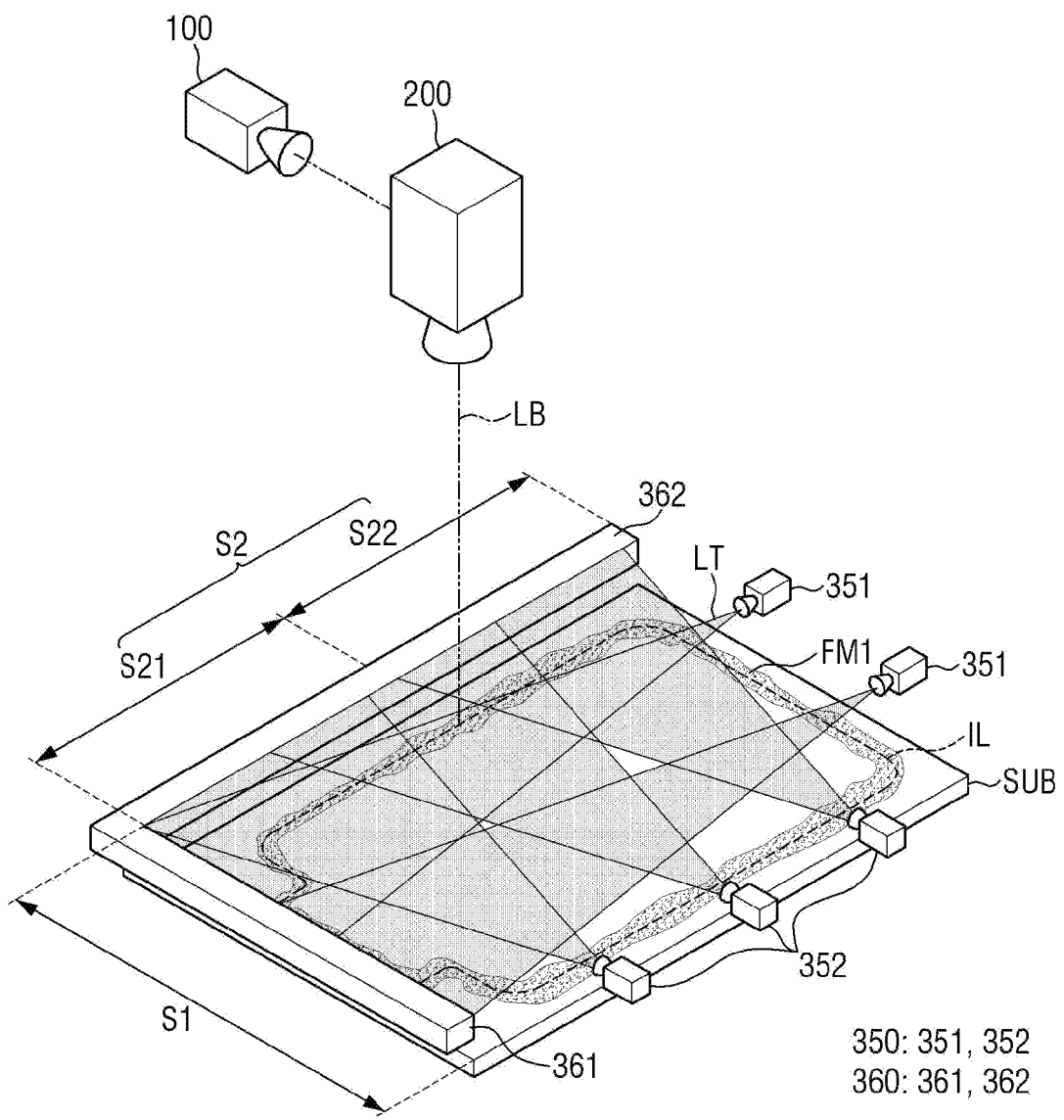
FIGS. 6 and 7 are schematic views illustrating operations of optical sensors in an apparatus for manufacturing a display device according to an embodiment.
Figure 7:
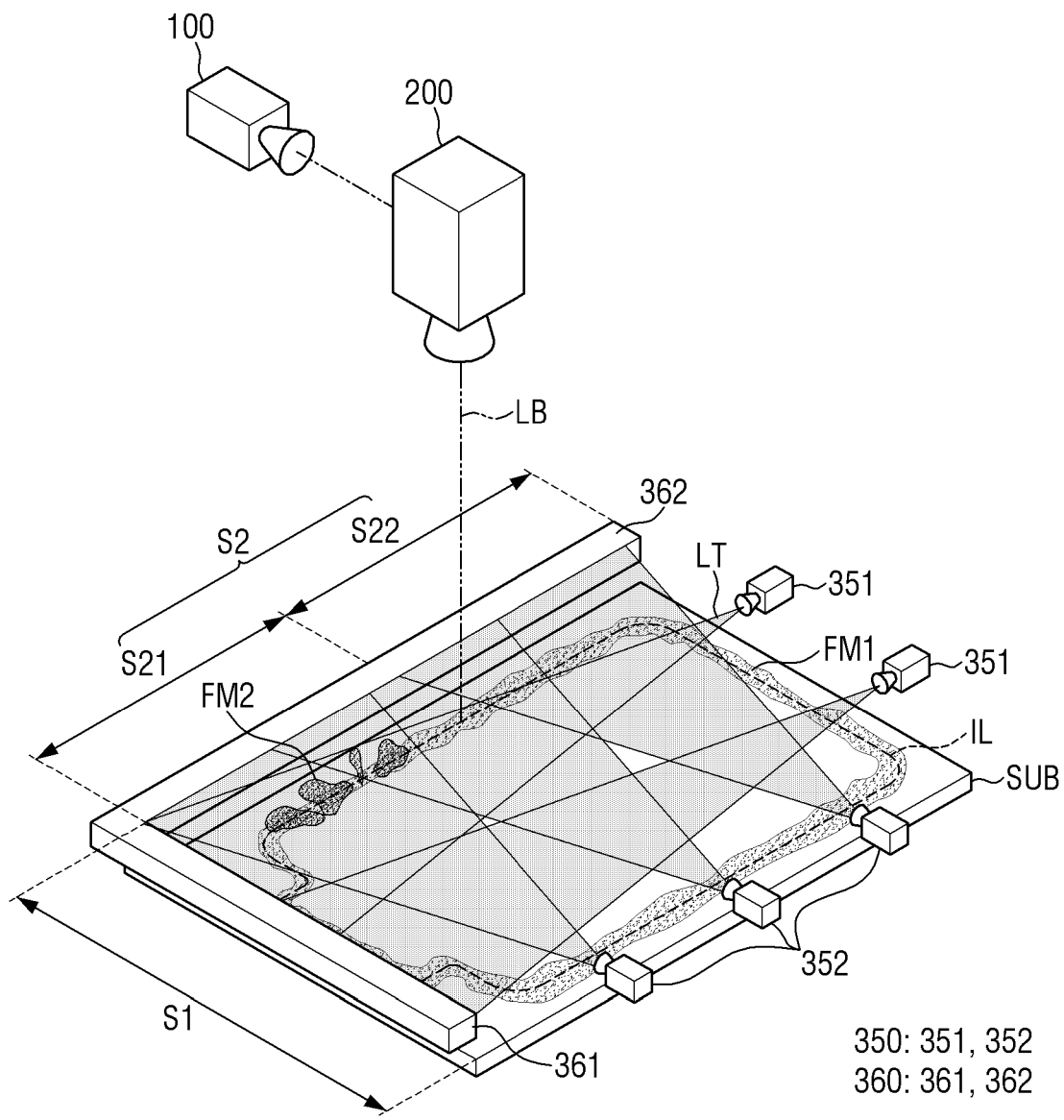
Figure 8:
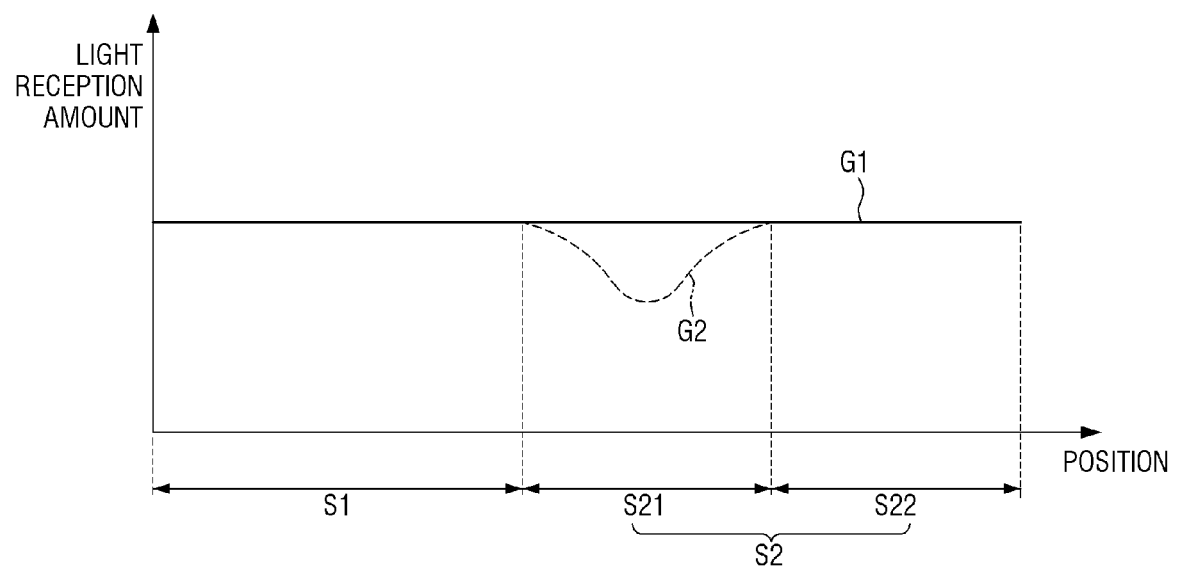
FIG. 8 is a graph illustrating a light reception amount measured by a light receiving unit of an optical sensor of an apparatus for manufacturing a display device according to an embodiment.
Figure 9:
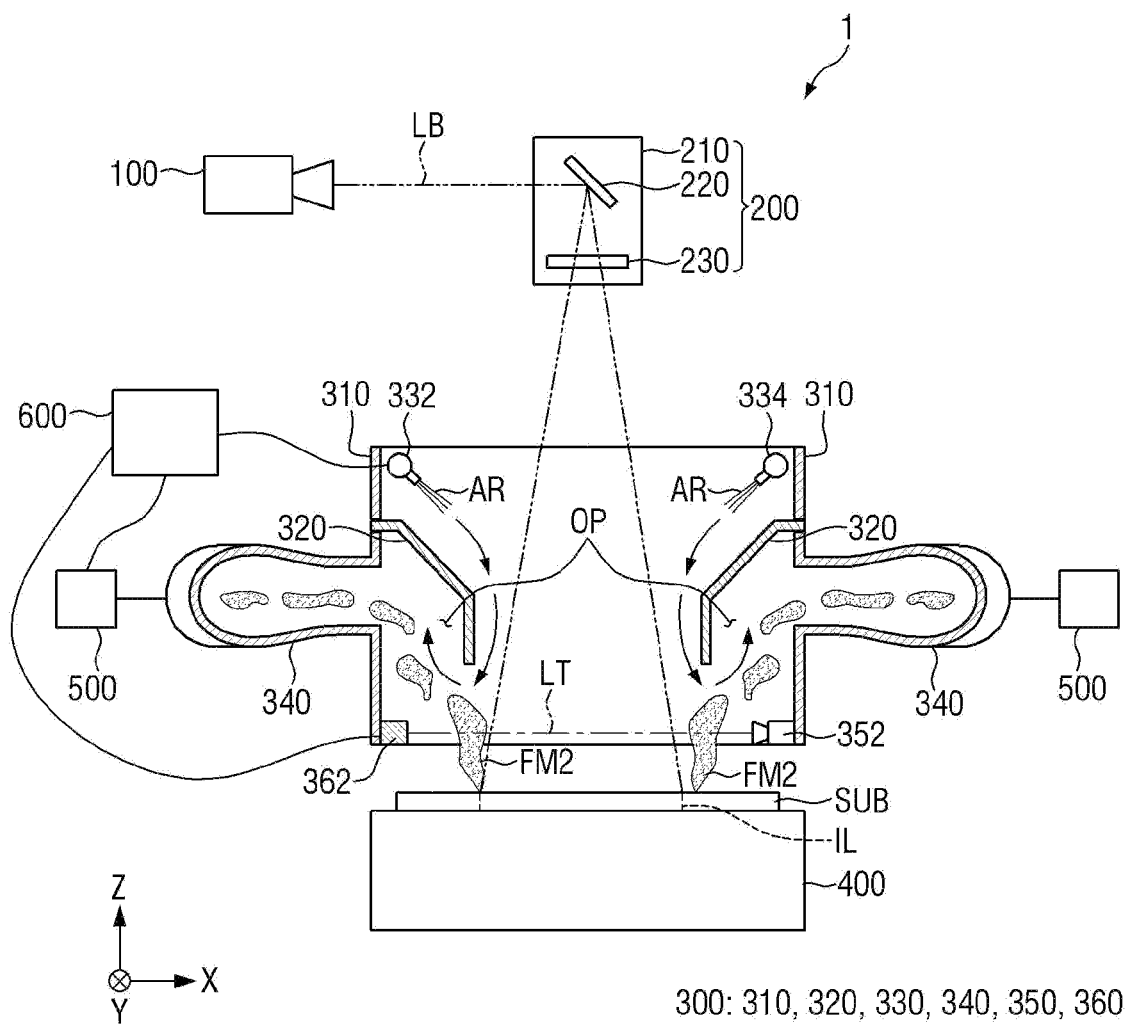
FIG. 9 is a schematic view illustrating a manufacturing process of a display device in a second mode of FIG. 8 by using an apparatus for manufacturing a display device according to an embodiment.

FIGS. 6 and 7 are schematic views illustrating operations of optical sensors in an apparatus for manufacturing a display device according to an embodiment. FIG. 8 is a graph illustrating the light reception amount measured by a light receiving unit of an optical sensor of an apparatus for manufacturing a display device according to an embodiment. FIG. 9 is a schematic view illustrating a manufacturing process of a display device in a second mode of FIG. 8 by using an apparatus for manufacturing a display device according to an embodiment.

FIG. 6 is a schematic view of a first mode in which the fumes FM1 are generated substantially constantly for each area of the target substrate SUB while the laser beam LB is irradiated. FIG. 7 is a schematic view of a second mode in which fumes FM2 are excessively generated in an area of the target substrate SUB while the laser beam LB is irradiated.

Referring to FIGS. 6 to 9, the light LT provided from the light emitting unit 350 may pass through the fumes FM1 to be received by the light receiving unit 360. The fumes FM1 may block the propagation of the light LT from the light emitting unit 350 toward the light receiving unit 360. Accordingly, the amount of light LT received by the light receiving unit 360 may be reduced when the amount of the generated fumes FM1 increases, and the amount of light LT received by the light receiving unit 360 may increase when the amount of the generated fumes FM1 is reduced. The amount of the generated fumes FM1 may be indirectly measured by the amount of received light measured by the light receiving unit 360.

In the first mode shown in FIG. 6, the fumes FM1 may be generated substantially constantly for each area of the target substrate SUB. For example, in the first mode, the light LT provided from the first light emitting module 351 may be received by the first light receiving unit 361 located in a first region 51. The light LT provided from the second light emitting module 352 may be received by the second light receiving unit 362 located in a second region S2. In the first mode, the amount of received light measured by the first light receiving unit 361 may be substantially constant for each area of the first region 51, and the amount of received light measured by the second light receiving unit 362 may be substantially constant for each area of the second region S2. However, the disclosure is not limited thereto, and the amount of received light in each area may follow a Gaussian distribution.

In a first graph G1 of FIG. 8, the amount of received light measured by the first light receiving unit 361 and the amount of received light measured by the second light receiving unit 362 are illustrated as being the same, but the disclosure is not limited thereto. The amount of received light measured by the first light receiving unit 361 and the amount of received light measured by the second light receiving unit 362 may be different. The first mode is a normal state, and the amount of the fumes FM1 generated from the target substrate SUB is substantially constant for each area, so that the amount of received light measured by the light receiving unit 360 may be constant. The measurement of the amount of the generated fumes FM1 using the optical sensors 350 and 360 may be performed based on the amount of the generated fumes FM1 and the amount of received light measured by the light receiving unit 360 in the first mode.

In the second mode shown in FIG. 7, the fumes FM2 may be generated excessively in an area of the target substrate SUB. For example, in the second mode, the light LT provided from the first light emitting module 351 may be received by the first light receiving unit 361 located in the first region 51. Further, in the second mode, the light LT provided from the second light emitting module 352 may be received by the second light receiving unit 362 located in the second region S2. In the second mode, the amount of received light measured by the first light receiving unit 361 may be the same as in the first mode, but the amount of received light measured by the second light receiving unit 362 may be different from that in the first mode. For example, in the second mode, the second region S2 may include a first sub-region S21 that receives different amount of light than in the first mode and a second sub-region S22 having the same amount of received light as that in the first mode.

In a second graph G2 of FIG. 8, the amount of received light measured by the light receiving unit 360 in the case of the first region 51 and the second sub-region S22 may be substantially the same as the amount of received light shown in the first graph G1. However, in the second graph G2, the amount of received light measured by the light receiving unit 360 in the case of the first sub-region S21 may be smaller than the amount of received light in the first graph G1.

The second mode is an abnormal state, and the amount of the fumes FM1 generated from the target substrate SUB may be substantially the same as that in the first mode, but a greater amount of the fumes FM2 than in the first mode may be generated in some areas. An area in which the amount of received light measured by the light receiving unit 360 is reduced compared to other areas may be formed. Accordingly, an area in which the amount of received light measured by the light receiving unit 360 in the second mode is smaller than the amount of received light measured by the light receiving unit 360 in the first mode may be formed.

As described above, in the second mode, a greater amount of the fumes FM2 may be generated in some areas than in other areas. For example, in the second mode, a greater amount of the fumes FM2 may be generated in the first sub-region S21 than in other areas. The controller 600 may spray stronger air AR onto the first sub-region S21 through the second and fourth air blowers 332 and 334 as shown in FIG. 9, and a stronger negative pressure may be provided to the first sub-region S21 through the dust collecting module 500. The suction unit 300 according to an embodiment may quantitatively measure the amount of the generated fumes FM1 and FM2 for each area through the optical sensors 350 and 360, spray the stronger air AR onto the area in which a greater amount of the fumes FM2 is generated with respect to a normal state, and provide the stronger negative pressure to remove the fumes FM2 more easily.

Figure 10:
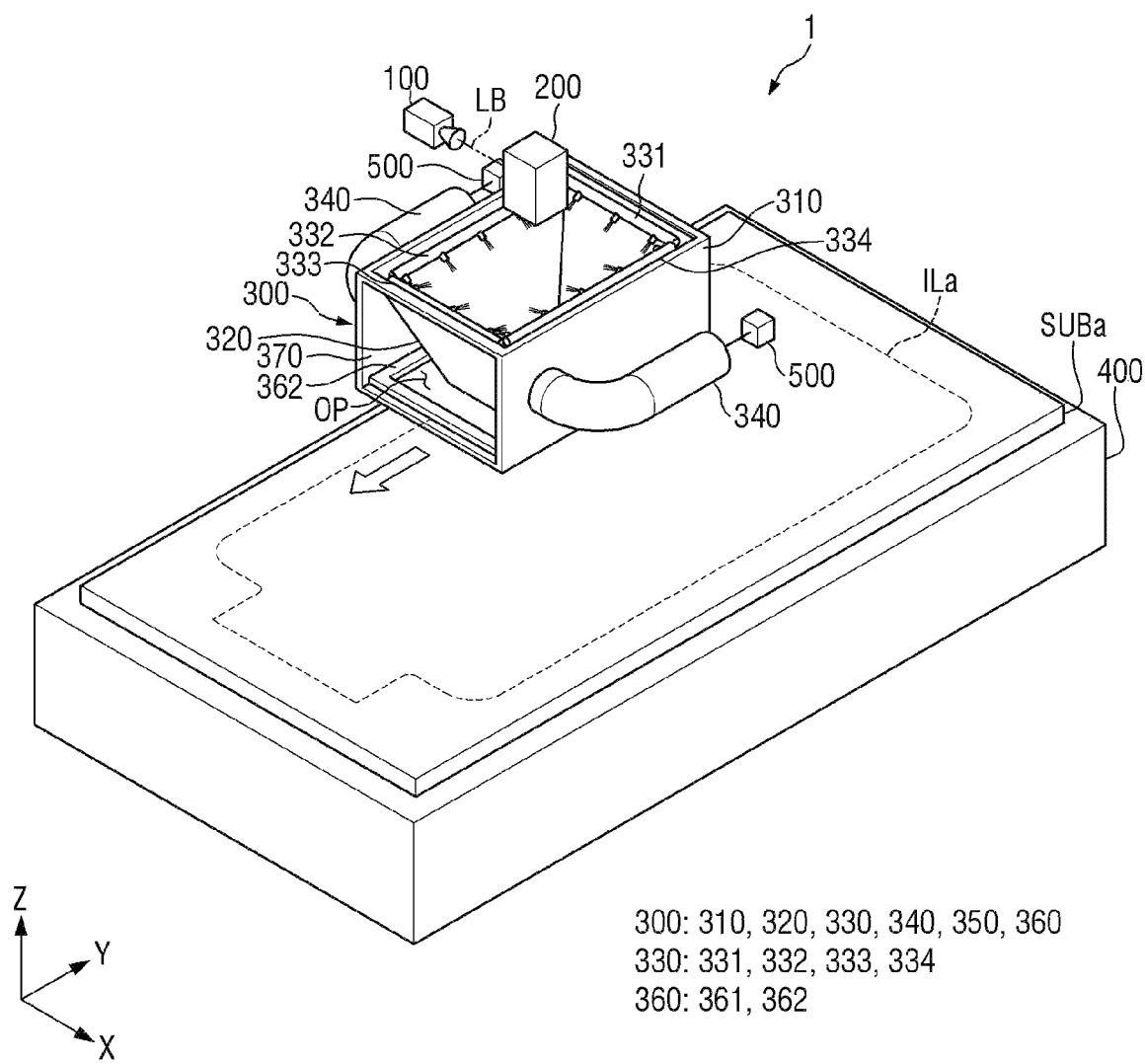
FIGS. 10 and 11 are schematic views illustrating a manufacturing process of a display device of another application example using an apparatus for manufacturing a display device according to an embodiment.
Figure 11:
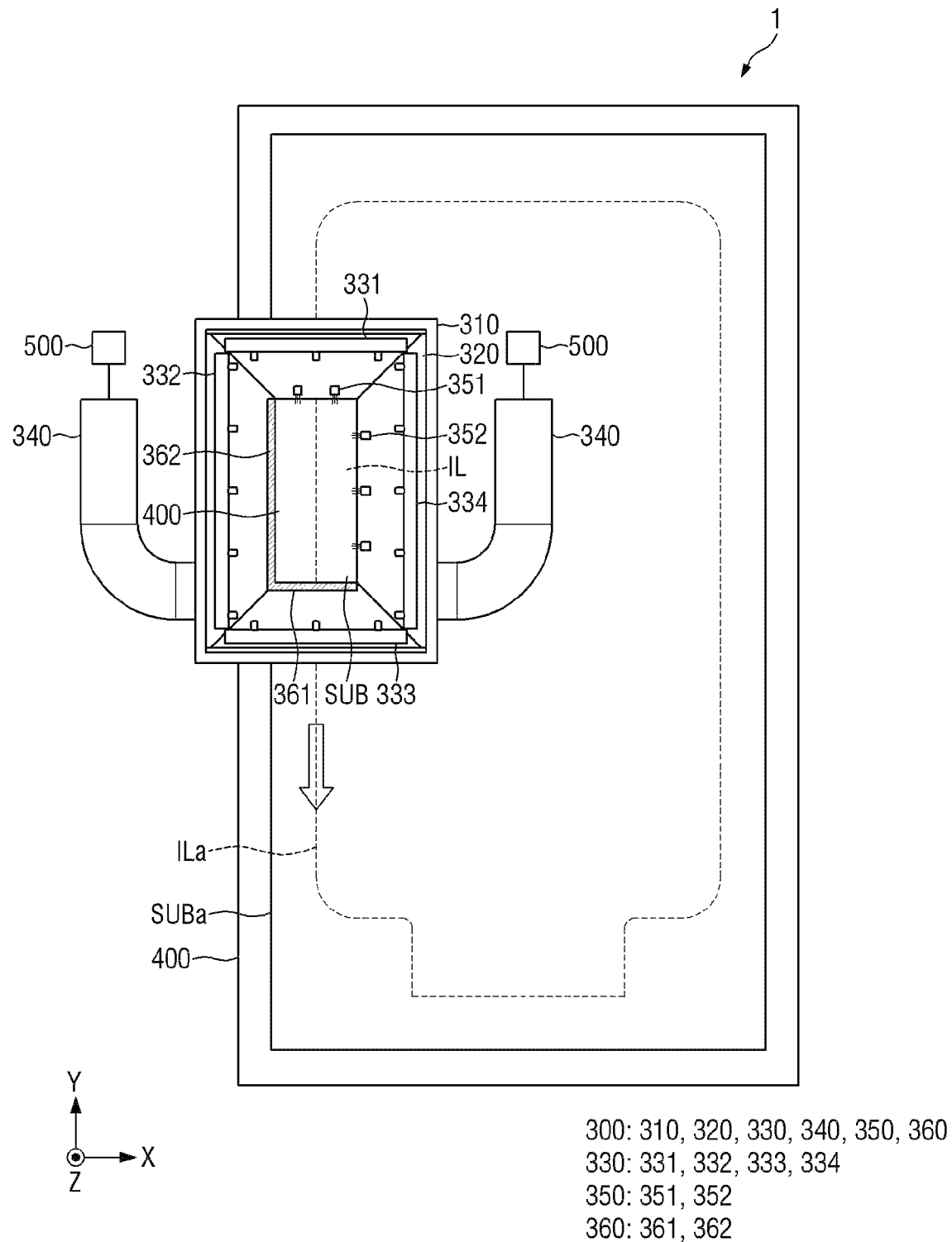

FIGS. 10 and 11 are schematic views illustrating a manufacturing process of a display device of an example using an apparatus for manufacturing a display device according to an embodiment.

Referring to FIGS. 10 and 11, the display device manufacturing apparatus 1 according to an embodiment may move to process a target substrate SUBa. Here, the target substrate SUBa may be larger than the target substrate SUB in FIGS. 3 to 9. The display device manufacturing apparatus 1 according to an embodiment may move along the irradiation line ILa which is an imaginary cutting line formed on the target substrate SUBa and irradiate the laser beam LB. The suction unit 300 may quantitatively measure the amount of the generated fumes FM1 and FM2 (refer to FIGS. 5 and 9) for each area through the optical sensors 350 and 360. The optical sensors 350 and 360 may indirectly measure the amount of the generated fumes FM1 and FM2 as the amount of received light and provide it to the controller 600. The controller 600 may spray the stronger air AR through the air blower 330 onto the area in which a greater amount of the fumes FM1 and FM2 than in a normal state are generated and provide a stronger negative pressure through the dust collecting module 500 to perform the removal of the fumes FM1 and FM2 more effectively.

According to the display device manufacturing apparatus 1 according to one embodiment, the amount of the fumes FM1 and FM2 (refer to FIGS. 5 and 9) generated in the laser manufacturing process for processing the target substrate SUBa using the optical sensors 350 and 360 may be quantitively measured. Accordingly, the intensity of the air AR may be increased or the negative pressure for sucking the fumes FM1 and FM2 may be increased with respect to the area in which a greater amount of the fumes FM1 and FM2 are generated than other areas, thereby enabling effective removal of the fumes FM1 and FM2 to control the amount of the generated fumes FM1 and FM2.

Hereinafter, other examples of the display device manufacturing apparatus 1 will be described. In the description of the apparatus for manufacturing a display device according to an embodiments to be described below, repetitive descriptions from that of display device manufacturing apparatus 1 described above will be omitted, and description will focus on differences.

Figure 12A:
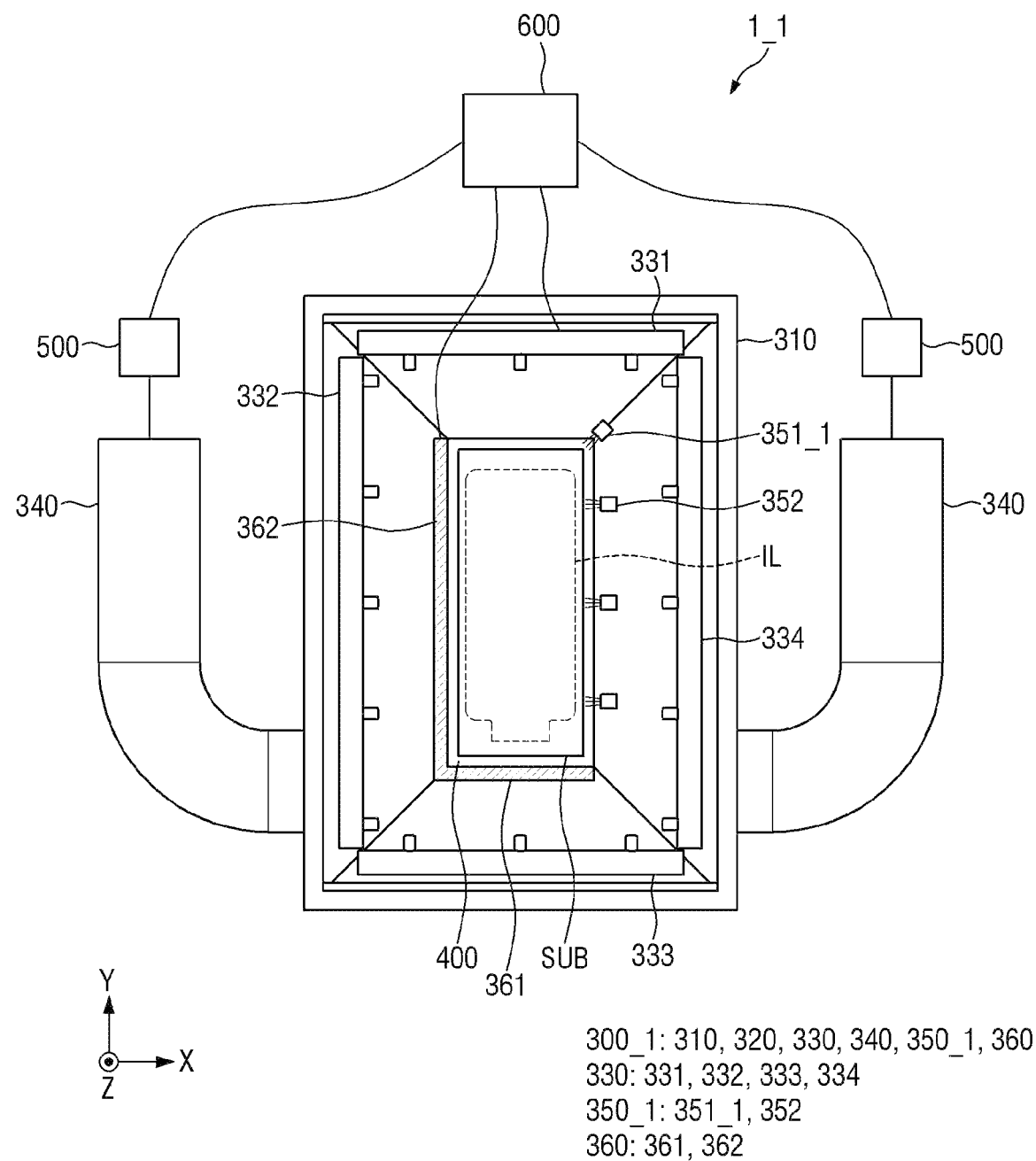
FIG. 12A is a schematic view illustrating an apparatus for manufacturing a display device according to an embodiment.

FIG. 12A is a schematic view illustrating an apparatus for manufacturing a display device according to an embodiment.

Referring to FIG. 12A, a display device manufacturing apparatus 1_1 according to an embodiment is different from the display device manufacturing apparatus 1 in that it includes optical sensors 350_1 and 360 including a different light emitting unit 350_1.

In the embodiment, a first light emitting module 351_1 may be disposed to face the light receiving unit 360. The first light emitting module 351_1 may be disposed such that the light LT is provided to the entire light receiving unit 360. For example, in case that the light receiving unit 360 is disposed on the inner surface of the outer box 310 on the other side of the first direction X and on the inner surface of the outer box 310 on the other side of the second direction Y, the first light emitting module 351_1 may be disposed at a corner of the outer box 310 on a side of the first direction X and a side of the second direction Y. The first light emitting module 351_1 may be disposed opposite to an area in which the first light receiving unit 361 and the second light receiving unit 362 meet. The light LT provided from the first light emitting module 351_1 may be received by the entire light receiving unit 360. The light LT provided from the first light emitting module 351_1 may be received by the first light receiving unit 361 and the second light receiving unit 362. Accordingly, it is possible to accurately measure the change in the amount of received light according to the amount of the generated fumes FM1 or FM2 (refer to FIGS. 5 and 9).

According to the display device manufacturing apparatus 1_1 according to the embodiment, the amount of the fumes FM1 or FM2 (refer to FIGS. 5 and 9) generated in the laser manufacturing process for processing the target substrate SUB using the optical sensors 350_1 and 360 may be quantitively measured. Thus, the intensity of the air AR may be increased or the negative pressure for sucking the fumes FM1 and FM2 may be increased with respect to the area in which a greater amount of the fumes FM1 and FM2 are generated than other areas, thereby enabling effective removal of the fumes FM1 and FM2 to control the amount of the generated fumes FM1 and FM2.

The display device manufacturing apparatus 1_1 according to an embodiment may accurately measure the difference in the amount of received light between the first mode which is a normal state and the second mode which is an abnormal state by including the first light emitting module 351_1 capable of providing the light LT to the entire light receiving unit 360.

Figure 12B:
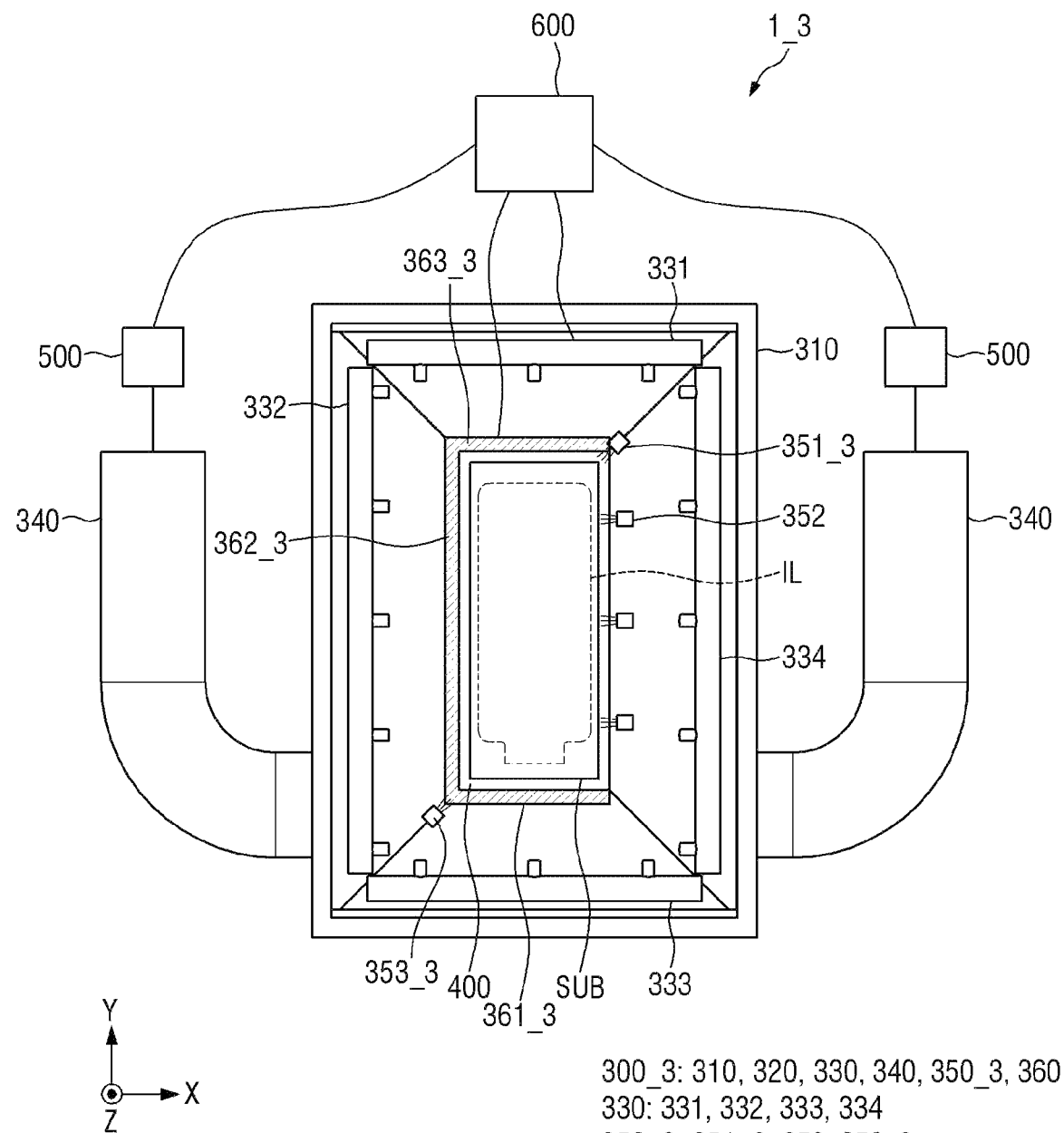
FIG. 12B is a schematic view illustrating an apparatus for manufacturing a display device according to an embodiment.

FIG. 12B is a schematic view illustrating an apparatus for manufacturing a display device according to an embodiment.

In FIG. 12B, a display device manufacturing apparatus 1_3 according to the embodiment is different from the display device manufacturing apparatus 1_1 shown in FIG. 12A in including optical sensors 350_3 and 360 including a different light emitting unit 350_3.

Referring to FIG. 12B, a third light emitting module 353_3 may be disposed in a region in which a first light receiving unit 361_3 and a second light receiving unit 362_3 meet. The third light emitting module 353_3 may be disposed to provide light to a third light receiving unit 363_3. For example, in case that the third light receiving unit 363_3 is disposed on the inner surface of the outer box 310 on the other side in the first direction X, the third light emitting module 353_3 may be disposed at a corner in which a side of the outer box 310 in the first direction X and a side of the outer box 310 in the second direction Y meet. The third light emitting module 353_3 may be disposed in an area in which the first light receiving unit 361_3 and the second light receiving unit 362_3 meet. The light LT provided from the third light emitting module 353_3 may be received by the light receiving unit 360. Accordingly, the change of the amount of received light according to the amount of the generated fumes FM1 and FM2 (refer to FIGS. 5 and 9) may be accurately measured.

According to the display device manufacturing apparatus 1_3 according to the embodiment, the amount of the fumes FM1 and FM2 (refer to FIGS. 5 and 9) generated in the laser manufacturing process for processing the target substrate SUB using the optical sensors 350_3 and 360 may be quantitively measured. Accordingly, the intensity of the air AR may be increased or the negative pressure for sucking the fumes FM1 and FM2 may be increased with respect to the area in which a greater amount of the fumes FM1 and FM2 are generated than other areas, thereby enabling effective removal of the fumes FM1 and FM2 to control the amount of the generated fumes FM1. Since the display device manufacturing apparatus 1_3 according to the embodiment additionally includes the third light emitting unit 363_3, it is possible to measure the amount of the generated fumes FM1 for each area more precisely.

Figure 14:
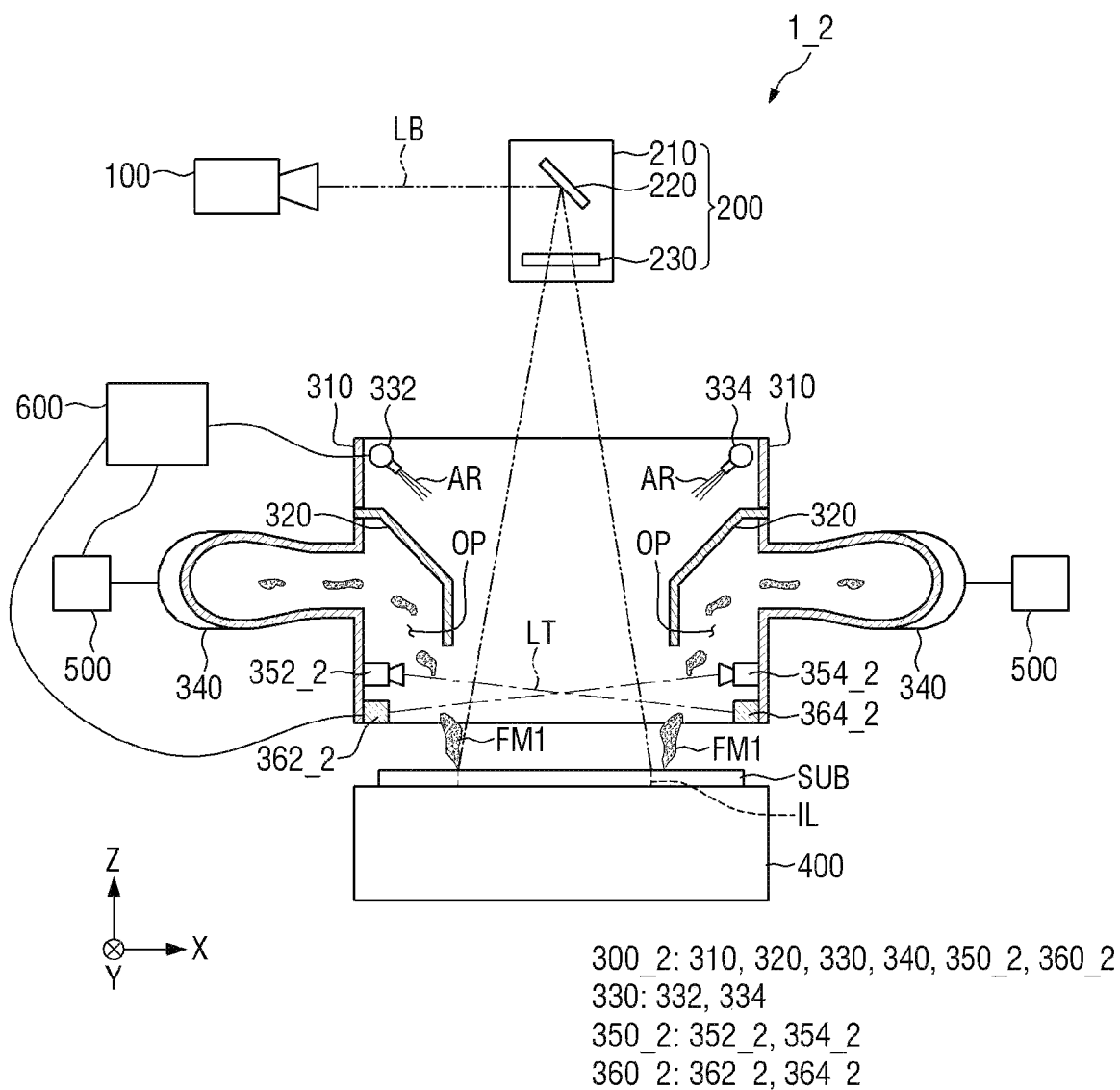

FIGS. 13 and 14 are schematic views illustrating an apparatus for manufacturing a display device according to an embodiment.

Referring to FIGS. 13 and 14, a display device manufacturing apparatus 1_2 according to the embodiment is different from a display device manufacturing apparatus 1 according to an embodiment in including a light receiving unit 360_2 entirely surrounding the inner surface of the outer box 310 and a light emitting unit 350_2 entirely surrounding the inner surface of the outer box 310.

In the embodiment, the light emitting unit 350_2 may include a first light emitting module 351_2 disposed on the inner surface of the outer box 310 on the other side of the second direction Y, a second light emitting module 352_2 disposed on the inner surface of the outer box 310 on the other side of the first direction X, a third light emitting module 353_2 disposed on the inner surface of the outer box 310 on a side of the second direction Y and a fourth light emitting module 354_2 disposed on the inner surface of the outer box 310 on a side of the first direction X.

In an embodiment, the light receiving unit 360_2 may include a first light receiving unit 361_2 disposed on the inner surface of the outer box 310 on a side in the second direction Y, a second light receiving unit 362_2 disposed on the inner surface of the outer box 310 on a side in the first direction X, a third light receiving unit 363_2 disposed on the inner surface of the outer box 310 on the other side in the second direction Y, and a fourth light receiving unit 364_2 disposed on the inner surface of the outer box 310 on the other side in the first direction X.

In the embodiment, the light emitting unit 350_2 may be disposed on a side of the light receiving unit 360_2 in a third direction Z. The light emitting unit 350_2 may be disposed above the light receiving unit 360_2. The first light emitting module 351_2 may be disposed on a side of the first light receiving unit 361_2 in the third direction Z, the second light emitting module 352_2 may be disposed on a side of the second light receiving unit 362_2 in the third direction Z, the third light emitting module 353_2 may be disposed on a side of the third light receiving unit 363_2 in the third direction Z and the fourth light emitting module 354_2 may be disposed on a side of the fourth light receiving unit 364_2 in the third direction Z.

The light LT provided from the light emitting unit 350_2 may be received by the light receiving unit 360_2 positioned at the opposite side. For example, the light LT provided from the first light emitting module 351_2 may be received by the third light receiving unit 363_2, the light LT provided from the second light emitting module 352_2 may be received by the fourth light receiving unit 364_2, the light LT provided from the third light emitting module 353_2 may be received by the first light receiving unit 361_2 and the light LT provided from the fourth light emitting module 354_2 may be received by the second light receiving unit 362_2.

In the display device manufacturing apparatus 1_2 according to the embodiment, the light emitting unit 350_2 and the light receiving unit 360_2 are disposed on the entire inner surface of the outer box 310 to measure the amount of light received for each area in various areas, thereby measuring the amount of the generated fumes FM1 more precisely.

According to the display device manufacturing apparatus 1_2 according to the embodiment, the amount of the fumes FM1 generated in the laser manufacturing process for processing the target substrate SUB using the optical sensors 350_2 and 360_2 may be quantitively measured. Thus, the intensity of the air AR may be increased or the negative pressure for sucking the fumes FM1 may be increased with respect to the area in which a greater amount of the fumes FM1 are generated than other areas, thereby easily performing effective removal of the fumes FM1 to control the amount of the fumes FM1 generated.

The display device manufacturing apparatus 1_2 according to an embodiment may include the light emitting unit 350_2 and the light receiving unit 360_2 disposed on the entire inner surface of the outer box 310 to measure the amount of the fumes FM1 generated for each area precisely.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An apparatus for manufacturing a display device, comprising:
   a stage on which a target substrate is mounted; and
   a suction unit positioned above the stage to be spaced apart from the stage and the target substrate, the suction unit including:
   a main body including:
   an outer box with top and bottom openings; and
   an inner cup disposed in the outer box,
   a light emitting unit disposed on at least one inner surface of the outer box, the light emitting unit providing light; and
   a light receiving unit disposed opposite to the light emitting unit, and disposed on at least one inner surface of the outer box, the light receiving unit receiving the light provided from the light emitting unit.

2. The apparatus of claim 1, wherein the light emitting unit and the light receiving unit are disposed in a region of the outer box that does not overlap the inner cup.

3. The apparatus of claim 2, wherein
   the light receiving unit includes:
   a first light receiving unit extending in a first direction; and
   a second light receiving unit extending in a second direction that intersects the first direction.

4. The apparatus of claim 3, wherein the light emitting unit is disposed opposite to the first light receiving unit and includes first light emitting modules arranged in the first direction.

5. The apparatus of claim 4, wherein the light emitting unit includes second light emitting modules disposed opposite to the second light receiving unit, the second light emitting modules being disposed on the inner surface of the outer box and arranged in the second direction.

6. The apparatus of claim 4, wherein the light emitting unit includes a second light emitting module, the second light emitting module facing a region on the inner surface of the outer box where the first light receiving unit and the second light receiving unit are disposed together.

7. The apparatus of claim 1, further comprising:
   a controller, wherein
   the suction unit includes an air blower that sprays air toward the stage, the air blower being coupled to the main body, and
   the controller controls operations of the air blower and the suction unit.

8. The apparatus of claim 7, wherein the controller controls the air blower to increase an intensity of air sprayed toward an area of the light receiving unit in case that an amount of light received in the area of the light receiving unit is reduced.

9. The apparatus of claim 7, further comprising:
   a dust collection unit connected to the suction unit,
   wherein the suction unit includes:
   a suction part defined between the outer box and the inner cup; and
   a connection pipe connecting the suction part to the dust collection unit.

10. The apparatus of claim 9, wherein
the dust collection unit provides a negative pressure to the suction unit, and
the controller controls the dust collection unit to increase a negative pressure provided toward an area of the light receiving unit in case that an amount of light that is received in the area of the light receiving unit is reduced.

11. The apparatus of claim 1, wherein
the light emitting unit surrounds the inner surface of the outer box,
the light receiving unit surrounds the inner surface of the outer box, and
the light emitting unit is positioned above the light receiving unit.

12. The apparatus of claim 11, wherein the light emitting unit includes light emitting modules arranged in a first direction, each of the light emitting modules providing light to the light receiving unit disposed opposite to the inner surface of the outer box on which the light emitting module is disposed.

13. An apparatus for manufacturing a display device, comprising:
a stage on which a target substrate is mounted; and
a suction unit positioned above the stage, the suction unit including:
a suction part providing a negative pressure to the target substrate;
a light emitting unit disposed adjacent to the suction part and providing light; and
a light receiving unit positioned opposite to the light emitting unit while being adjacent to the suction part and receiving the light provided from the light emitting unit, wherein
in a first mode, a light reception amount indicated by the light receiving unit is a normal state, and
in a second mode, the light reception amount is smaller than in the first mode.

14. The apparatus of claim 13, wherein the negative pressure provided by the suction part is greater in the second mode than in the first mode.

15. The apparatus of claim 14, further comprising:
a dust collection unit connected to the suction unit, the dust collection unit providing a negative pressure to the suction unit,
wherein the suction unit includes a connection pipe connecting the suction unit to the dust collection unit.

16. The apparatus of claim 13, wherein
the suction unit includes an air blower that sprays air toward the stage, and
an intensity of the air sprayed by the air blower is greater in the second mode than in the first mode.

17. The apparatus of claim 13, wherein the light receiving unit includes:
a first light receiving unit extending in a first direction; and
a second light receiving unit extending in a second direction that intersects the first direction.

18. The apparatus of claim 17, wherein
the light emitting unit is disposed opposite to the first light receiving unit, and
the light emitting unit includes first light emitting modules arranged in the first direction.

19. The apparatus of claim 18, wherein
the light emitting unit is disposed opposite to the second light receiving unit, and
the light emitting unit includes second light emitting modules arranged in the second direction.

20. The apparatus of claim 18, wherein the light emitting unit includes a second light emitting module that faces a region where the first light receiving unit and the second light receiving unit are disposed together.

* * * * *